United States Patent
Kwak

(10) Patent No.: US 6,548,319 B2
(45) Date of Patent: Apr. 15, 2003

(54) METHOD FOR MANUFACTURING SEMICONDUCTOR LASER DIODE

(75) Inventor: Joon-Seop Kwak, Suwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 09/925,327

(22) Filed: Aug. 10, 2001

(65) Prior Publication Data

US 2002/0048835 A1 Apr. 25, 2002

(30) Foreign Application Priority Data

Aug. 12, 2000 (KR) .......................... 2000-46767

(51) Int. Cl.[7] ............................. H01L 21/00

(52) U.S. Cl. ..................... 438/38; 438/40; 438/41; 438/46; 438/47

(58) Field of Search .................... 438/38, 40, 41, 438/46, 47

(56) References Cited

U.S. PATENT DOCUMENTS

| | | | | |
|---|---|---|---|---|
| 4,666,556 A | * | 5/1987 | Fulton et al. ............... 438/431 |
| 5,208,183 A | * | 5/1993 | Chen et al. ................. 438/32 |
| 5,658,823 A | * | 8/1997 | Yang ........................... 438/38 |
| 5,892,785 A | * | 4/1999 | Nagai ......................... 257/192 |
| 6,052,399 A | * | 4/2000 | Sun ............................. 372/46 |

* cited by examiner

*Primary Examiner*—Amir Zarabian
*Assistant Examiner*—Jeff Vockrodt
(74) *Attorney, Agent, or Firm*—Burns Doane Swecker & Mathis, LLP

(57) ABSTRACT

A method for manufacturing a semiconductor laser diode is described. The method for manufacturing a semiconductor laser diode includes sequentially forming a buffer layer, a first clad layer, a first waveguide layer, an active layer, a second waveguide layer, a second clad layer, and a cap layer on a substrate, patterning the cap layer, and patterning the second clad layer as a ridge structure by making the patterned cap layer as an upper layer, selectively forming a passivation layer for covering the second clad layer patterned as the ridge structure around the cap layer, and forming an electrode in contact with the cap layer on the passivation layer.

8 Claims, 6 Drawing Sheets

METHOD FOR MANUFACTURING SEMICONDUCTOR LASER DIODE

BACKGROUND OF THE INVENTION

1. Field of the Invention

The present invention relates to a method for manufacturing a semiconductor laser diode, and more particularly, to a method for manufacturing a semiconductor laser diode in which a stable electrode is formed on the upper portion of a ridge having a narrow width by forming a passivation layer in a self-alignment method.

2. Description of the Related Art

Generally, since a laser beam generated from a laser diode has a narrow frequency width and a high directivity, the laser beam is applied in various fields such as optical communications, multiple communications, and space communications.

One of the main applications of the laser diode in the field of optical communications is in optical disc reading/recording systems. Nowadays, a laser diode having superior characteristics which can be oscillated with a low current and operated for a long time is required for compact disk players and compact disk reading/writing systems.

A conventional GaN semiconductor laser diode is manufactured by crystalizing and growing a multilayer laser structure on a sapphire substrate, and the structure has a ridge structure, wherein a p-type electrode is formed after a multilayer crystal is grown.

Particularly, as shown in FIG. 1, a buffer layer 4, a first clad layer 6, a first waveguide layer 8, an active layer 10, a second waver layer 12, a second clad layer 14, and a cap layer 16 are sequentially formed on a substrate 2. The buffer layer 4 is formed of an n-type GaN layer. The first clad layer 6 is formed of an n-type AlGaN/GaN layer. The first waveguide layer 8 is formed of an n-type GaN layer. The active layer 10 is formed of an InGaN MQW(Multi-Quantum Well) layer. The second waveguide layer 12 is formed of a p-type GaN layer. The second clad layer 14 is formed of a p-type AlGaN/GaN layer. The cap layer 16 is formed of a p-type GaN layer. After a photoresist layer (not shown) is formed on the cap layer 16, a photoresist layer pattern 18 is formed by photolithography for forming a ridge structure. The second clad layer 14 is dry-etched to a predetermined depth using the photoresist layer pattern 18 as an etching mask. Then, the photoresist layer pattern 18 is removed, as shown in FIG. 2, and the second clad layer 14 is formed as a ridge structure. Subsequently, as shown in FIG. 3, a passivation layer 22 is formed over the entire surface of the resultant structure after removing the photoresist layer patten 18.

Referring to FIG. 4, after a photoresist layer (not shown) is formed on the passivation layer 22, a photoresist layer pattern 23 is formed for exposing the passivation layer 22 formed on the cap layer 16 by photolithography. The exposed portion of the passivation layer 22 is etched using the photoresist layer pattern 23 as an etching mask. As a result, a via hole 24 for exposing the cap layer 16 is formed. Then, the photoresist layer pattern 23 is removed.

Referring to FIGS. 5 and 6, a p-type electrode 26 is formed on the passivation layer 22 around the via hole 24 in contact with the cap layer 16 (FIG. 5), or a p-type electrode 26a is formed by filling the via hole 24 (FIG. 6).

The passivation layer 22 blocks the flow of current and defines a current path between the p-type electrodes (26, 26a) formed wider than the ridge width and the etched surface, and the ridge width is only a few μm, so that stability and reproducibility of the passivation layer etching process (formation of the via hole 24) is low, the process is complicated, and a process for manufacturing devices becomes long and difficult.

SUMMARY OF THE INVENTION

To solve the above problems, it is an objective of the present invention to provide a method for manufacturing a semiconductor laser diode in which a stable p-type electrode is formed, and a passivation layer is formed by a self-alignment method using an etching mask applied to an etching process for forming a ridge structure.

Accordingly, to achieve the above objective, there is provided a method for manufacturing a semiconductor laser diode comprising sequentially forming a buffer layer, a first clad layer, a first waver layer, an active layer, a second waveguide layer, a second clad layer, and a cap layer on a substrate, forming an etching mask on the cap layer, sequentially patterning the cap layer and the second clad layer using the etching mask, and forming a ridge structure by etching the second clad layer in a range of not exposing the active layer, selectively forming a passivation layer for covering the side walls of the cap layer and the second clad layer patterned as the ridge structure using the etching mask, and forming an electrode in contact with the cap layer on the passivation layer when the etching mask is removed.

Preferably, in the above process, the passivation layer is formed by oxidizing the side walls of the ridge structure and the entire exposed surface around the ridge structure, or by directly forming an oxide layer on the side walls of the ridge structure and the entire exposed surface around the ridge structure.

The entire exposed surface around the ridge structure is the entire surface of the second clad layer or the second waveguide layer around the ridge structure.

Preferably, the substrate is a sapphire substrate, a GaN substrate or an SiC substrate.

Preferably, the buffer layer and the first waveguide layer are n-type GaN layers, the first clad layer is an n-type AlGaN/GaN layer, the active layer is an InGaN layer, the second waveguide layer and the cap layer are p-type GaN layers, and the second clad layer is a p-type AlGaN/GaN layer.

Preferably, the etching mask is a photoresist layer, a silicon oxide layer, or a nickel layer.

Preferably, the oxide layer is $TiO_2$, $ZrO_2$, or $SiO_2$.

Preferably, the electrode is formed of a Pd layer.

Also, to achieve the above objective, there is provided a method for manufacturing a semiconductor laser diode comprising sequentially forming a buffer layer, a first clad layer, a first waveguide layer, an active layer, a second waveguide layer, a second clad layer, and a cap layer on a substrate, forming an etching mask on the cap layer, sequentially patterning the cap layer and the second clad layer using the etching mask, and forming a ridge structure by etching the second clad layer in a range of not exposing the active layer, forming a metal layer on the entire surface of the exposed substrate including the ridge structure, in which the cap layer and the second clad layer are sequentially patterned, oxidizing the metal layer, and forming an electrode in contact with the cap layer on the oxide metal layer.

Preferably, in the above process, the metal layer is formed of a Ti layer, a Zr layer, or an Si layer. Also, it is preferable that the metal layer is oxidized by heat-treatment in an oxygen atmosphere.

According to the present invention, a passivation layer is formed by a self-alignment method which does not require photolithography for opening a ridge after forming a passivation layer, which is required in a conventional method for manufacturing a laser diode, so that manufacturing cost and time can be reduced. Also, an electrode can be stably formed on the upper portion of the ridge having a small width, so that reproducibility and productivity of the manufacturing process can be enhanced.

BRIEF DESCRIPTION OF THE DRAWINGS

The above objectives and advantages of the present invention will become is more apparent by describing in detail preferred embodiments thereof with reference to the attached drawings in which.

DETAILED DESCRIPTION OF THE INVENTION

A method for manufacturing a semiconductor laser diode according to first, second and third preferred embodiments of the present invention will be described in detail with reference to the accompanying drawings.

First Preferred Embodiment

Figure 1:
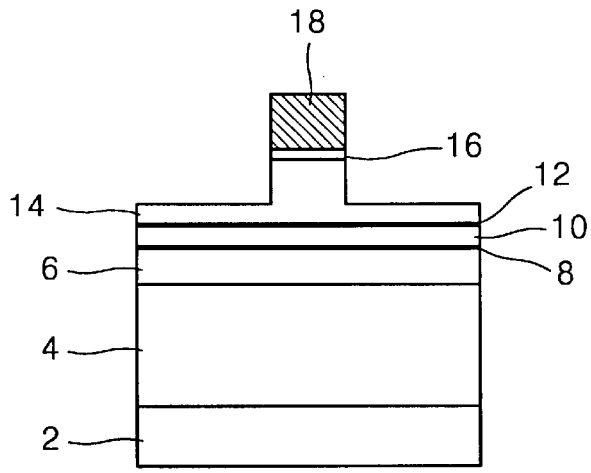
FIGS. 1 through 6 are sectional views illustrating a conventional method for manufacturing a semiconductor laser diode.
Figure 2:
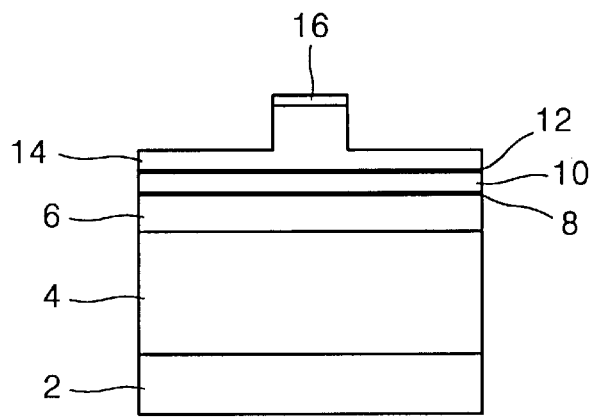
Figure 3:
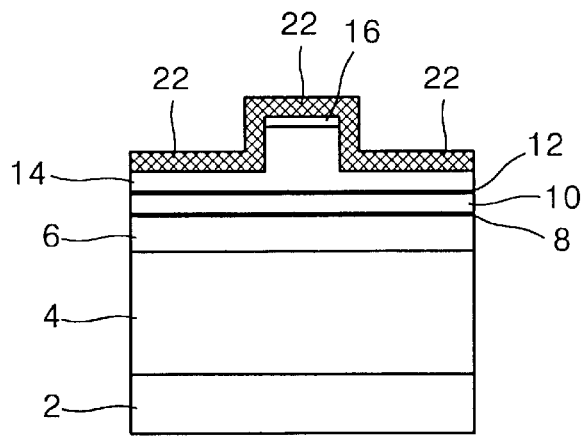
Figure 4:
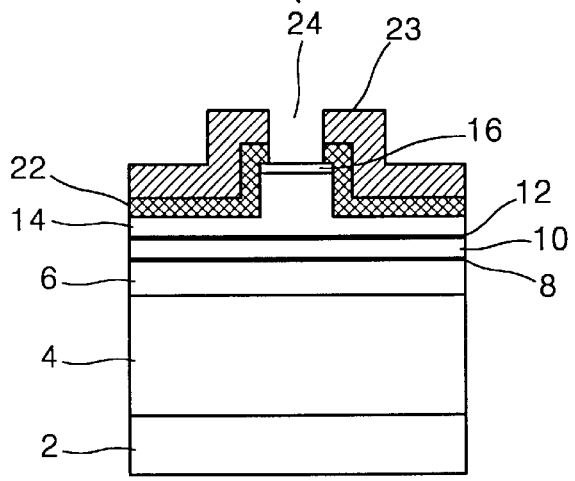
Figure 5:
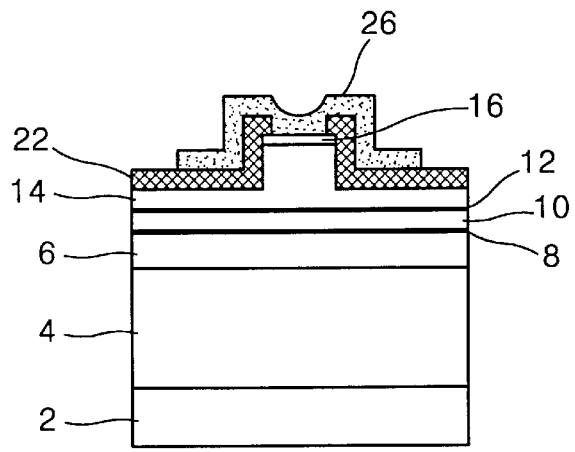
Figure 6:
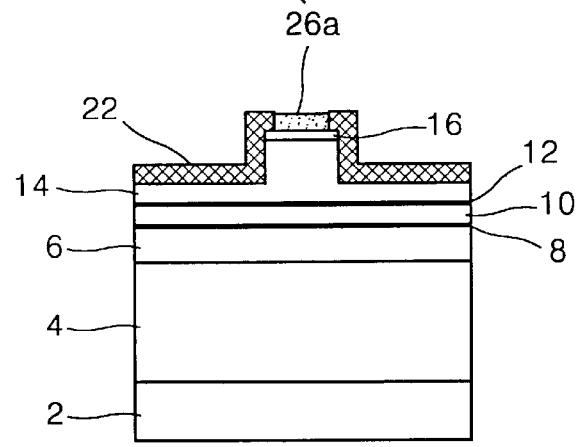
Figure 7:
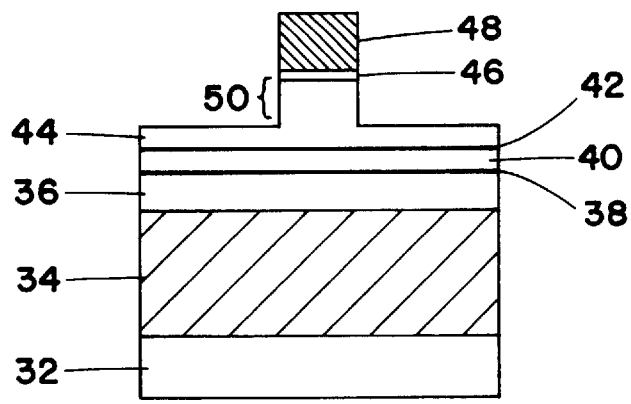
FIGS. 7 through 10 are sectional views illustrating a method for manufacturing a semiconductor laser diode according to a first preferred embodiment of the present invention.

Referring to FIG. 7, a buffer layer 34 is formed on a substrate 32. The substrate 32 is preferably a sapphire substrate but any substrate suitable for forming a laser diode can be used. For example, the substrate 32 is also a GaN substrate or an SiC substrate. The buffer layer 34 is formed of an n-type GaN layer. A first clad layer 36, a first waveguide layer 38, an active layer 40, a second waveguide layer 42, a second clad layer 44, and a cap layer 46 are sequentially formed on the buffer layer 34. The first clad layer 36 is preferably formed of an n-type AlGaN/GaN layer. The first waveguide layer 38 is preferably formed of an n-type GaN layer. The active layer 40 is preferably formed of an InGaN MQW(Multi-Quantum Well) layer. The second waveguide layer 42 is preferably formed of a p-type GaN layer. The cap layer 46 is preferably formed of a p-type GaN layer.

A photoresist layer (not shown) is formed for forming an etching mask on the cap layer 46. The photoresist layer is patterned to form a photoresist layer pattern 48 which covers a partial area of the cap layer 46, for example, an area for forming the second clad layer 44 as a ridge structure. The cap layer 46 and the second clad layer 44 are sequentially etched using the photoresist layer pattern 48 as an etching mask. It is preferable to use dry anisotropic etching for the above etch, but any etch method can be used. Also, after the exposed portion of the cap layer 46 is etched, the exposed portion of the second clad layer 44 is also etched, but it is preferable to etch within a range of not exposing the active layer 40. Therefore, the second waveguide layer 42 may be exposed by the etch. By the etch, a part of the second clad layer 44 is projected, and the cap layer 46 is formed to have a ridge structure 50 consisting of the projected portion. The etch can be performed so that the entire surface of the second clad layer 44 around the ridge structure 50 is exposed by etching the entire exposed surface of the second clad layer 44 to a predetermined thickness or the entire surface of the second waveguide layer 42 around the ridge structure 50 is exposed by completely etching the entire surface of the second clad layer 44.

Figure 8:
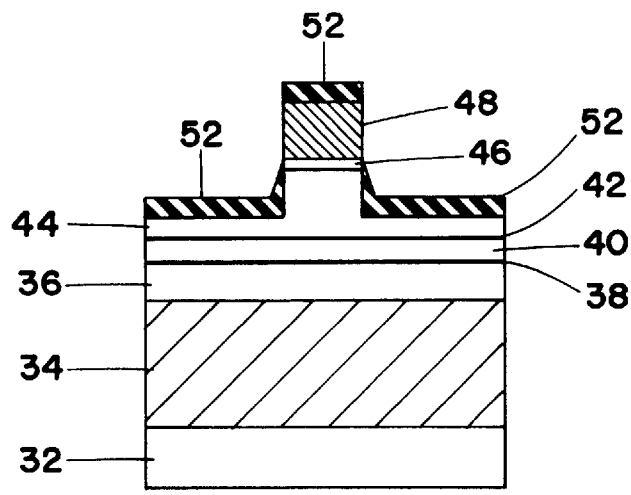

Referring to FIG. 8, a metal layer 52 is formed on the sidewalls of the ridge structure 50 and the entire surface of the exposed second clad layer 44 using the photoresist layer pattern 48 as an etching mask. The metal layer 52 is preferably formed of a titanum (Ti) layer. The metal layer 52 is formed on the photoresist layer pattern 48. The metal layer can be formed of any metal layer which can be oxidized instead of the titanium layer. For example, a zirconium (Zr) layer or a silicon (Si) layer can be used as the metal layer 52.

Figure 9:
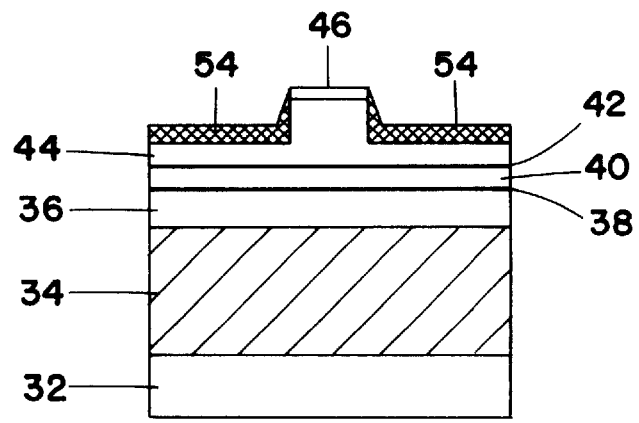

The photoresist layer pattern 48 and the metal layer 52 formed on the photoresist layer are removed. Then, the metal layer 52 has a structure in that the ridge structure 50 is selectively formed on the entire exposed surface except the upper surface of the cap layer 46. The metal layer 52 is heat-treated in an oxygen atmosphere. Here, the heat-treatment is preferably performed at a temperature higher than 400° C. As the result of the heat-treatment, as shown in FIG. 9, a metal oxide layer 54 is formed on the sidewalls of the ridge structure 50 and the entire exposed surface of the second clad layer 44. The metal oxide layer 54 is used as a passivation layer. Since the metal layer 54 is selectively formed, the passivation layer is also selectively formed. That is, the passivation layer is formed by self-alignment. The metal oxide layer 54 is preferably a titanium oxide layer ($TiO_2$).

Figure 10:
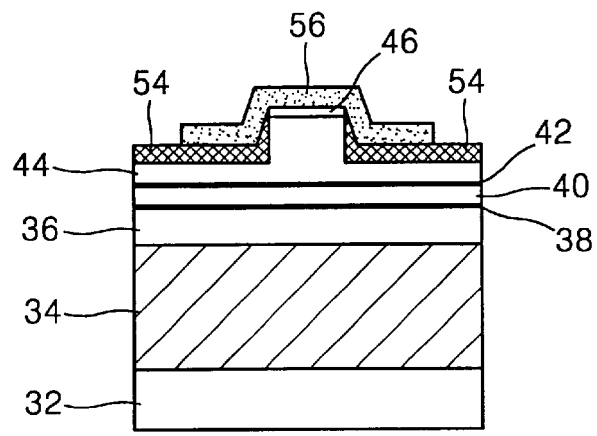

Referring to FIG. 10, after an electric layer (not shown) which will be used as an electrode is formed on the whole surface of the resultant structure having the metal oxide layer 54 as shown in FIG. 9, an electric layer pattern 56 in contact with the cap layer 46 and a part of the metal oxide layer 54 around the cap layer is formed using photolithography. The electric layer pattern 56 is a lead (Pb) layer pattern, and is used as a p-type electrode.

Second Preferred Embodiment

Hereinafter, if a reference numeral of a member is the same as mentioned in the first preferred embodiment, the member is the same member as mentioned in the first preferred embodiment.

Figure 11:
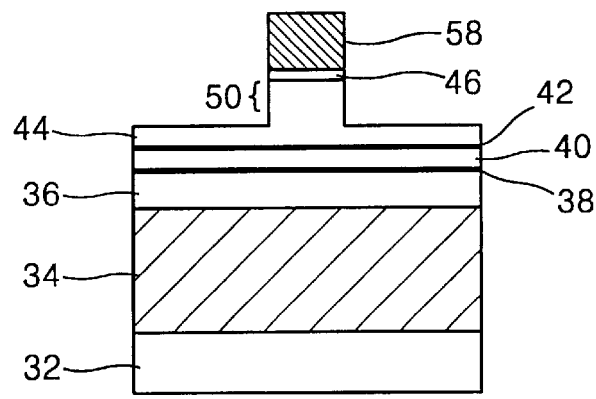
FIGS. 11 through 14 are sectional views illustrating a method for manufacturing a semiconductor laser diode according to a second preferred embodiment of the present invention.

Referring to FIG. 11, the first preferred embodiment is performed until the steps of forming the cap layer 46 on the substrate 32 and forming the second clad layer 44 as the ridge structure. In the second preferred embodiment, a hard mask 58 is used as an etching mask instead of the photoresist layer pattern. The hard mask 58 is preferably formed of a silicon oxide layer ($SiO_2$) or a nickel layer (Ni).

Figure 12:
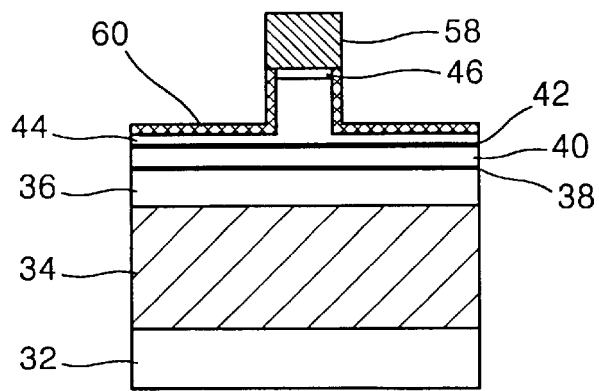

Referring to FIG. 12, the resultant structure, in which the cap layer 46 and the hard mask 58 are sequentially formed on the upper portion of the second clad layer 44 formed as the ridge structure 50, is heat-treated at a temperature higher than 600° C. in an oxygen atmosphere. The upper surface of the second clad layer is protected by the hard mask 58, and the hard mask 58 itself is oxidized, so that extra silicon (Si) is not included. Therefore, as the result of the heat-treatment, an oxide layer 60 is selectively formed on the entire exposed surface of the second clad layer 44 and the sidewalls of the ridge structure 50. The oxide layer 60 is used as a passivation layer.

Figure 13:
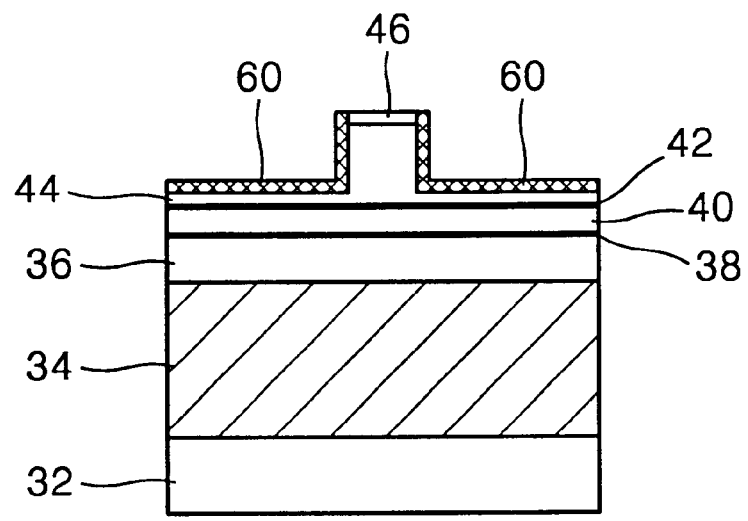
Figure 14:
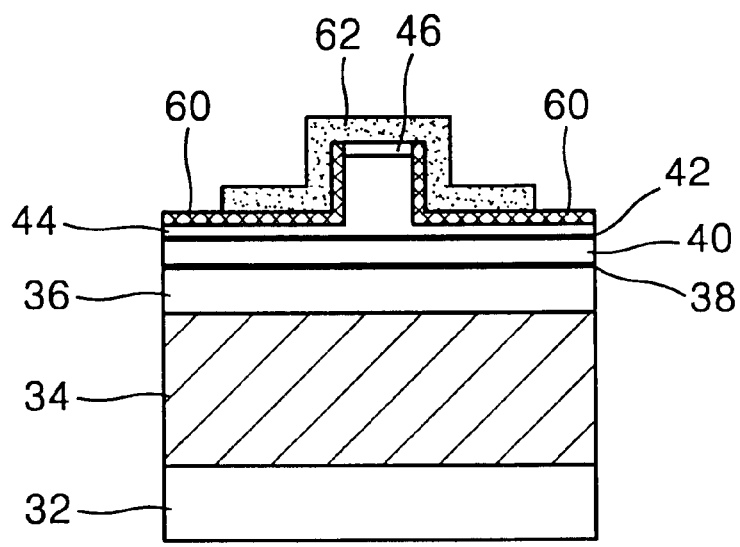

After the heat-treatment, as shown in FIG. 13, the hard mask 58 is removed. Next, an electric layer (not shown) which will be used as an electrode is formed on the entire surface of the resultant structure after removing the hard mask 58. The electric layer is patterned in the form of an electrode using photolithography, and as shown in FIG. 14, an electric layer pattern 62 in contact with the cap layer 46 and the oxide layer 60 around the cap layer is formed. The electric layer 62 is a lead layer pattern used as a laser diode electrode.

Third Preferred Embodiment

The third preferred embodiment is the same as the first preferred embodiment except that a process for forming the passivation layer is different.

Particularly, referring to FIGS. 8 and 9, in the first preferred embodiment, the metal oxide layer 54 which will be used as the passivation layer, is formed by selectively forming the metal layer 52 on the entire exposed surface except the upper surface of the ridge structure 50, and oxidizing the result. However, in the third preferred embodiment, when the photoresist layer pattern 48 is formed on the upper portion of the second clad layer 44, an oxide layer is directly formed on the entire exposed surface of the second clad layer 44 and the side walls of the ridge structure 50, the photoresist layer pattern 48 is removed, and the passivation layer is formed. Here, the oxide layer is formed of a titanium oxide layer ($TiO_2$), a zirconium oxide layer ($ZrO_2$), or a silicon oxide layer ($SiO_2$).

The passivation layer described in the first and third preferred embodiments blocks electric current between the p-type electrodes 56 and 60, formed larger than the ridge width of the projected portion of the second clad layer 44, and the second clad layer 44.

Figure 15:
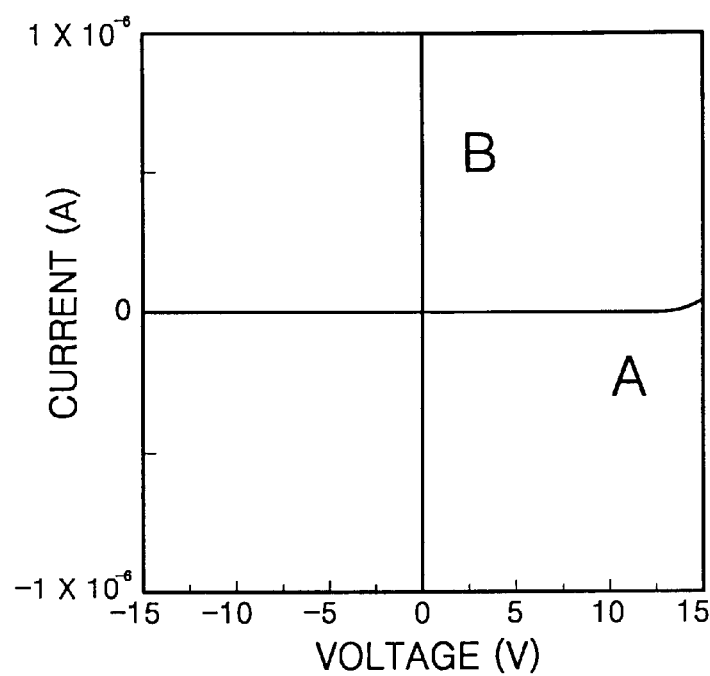
FIGS. 15 and 16 are graphs comparing current blocking of a passivation layer formed by a conventional technique with that of a passivation layer formed by method for manufacturing a semiconductor laser diode according to first and second preferred embodiments of the present invention, respectively.
Figure 16:
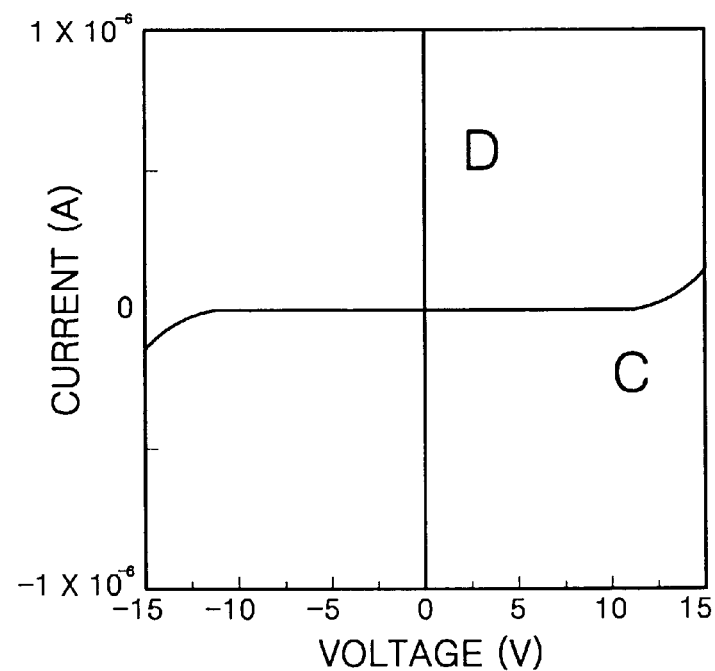

FIGS. 15 and 16 are graphs illustrating blockage of electric current of the passivation layer formed by the method for manufacturing a laser diode according to the first and second preferred embodiments of the present invention, respectively. Referring to FIG. 15, reference numeral A illustrates current-voltage characteristics when the lead layer pattern is formed as the p-type electrode on the passivation layer formed of a titanium oxide layer, that is, when the first preferred embodiment of the present invention is applied. Reference numeral B illustrates conventional current-voltage characteristics when the p-type electrode is formed only on the cap layer 46. In the conventional method, a current of $10^{-3}$ A results at 4.5 V, but in the present invention where a self-alignment method is applied, a very low electric current of $10^{-8}$ A results at a high voltage of 15 V.

Referring to FIG. 16, reference numeral C illustrates current-voltage characteristics when the passivation layer and the p-type electrode are formed according to the second preferred embodiment of the present invention, and reference numeral D illustrates current-voltage characteristics of the p-type electrode formed on the p-type GaN, that is, characteristics of the conventional method. In this case, a very low electric current of $10^{-7}$ A is applied at a high voltage of 15 V.

While this invention has been particularly shown and described with reference to preferred embodiments thereof, it should be understood that various alternatives are possible within the spirit and scope of the present invention. For example, it will be understood by those skilled in the art that a material layer for forming the passivation layer can be formed of other material in addition to the metal oxide layer or the oxide layer, and the p-type electrode material can be other material in addition to the lead layer. Due to these various possibilities, the scope of the present invention is defined not by the preferred embodiments but by the appended claims.

According to the present invention, the passivation layer is formed by the self-alignment method which does not require photolithography for opening the ridge after forming the passivation layer, which is required in the conventional method for manufacturing a laser diode, so that manufacturing cost and time can be reduced. Also, an electrode can be stably formed on the upper portion of the ridge having a small width, and reproducibility and productivity of the manufacturing process can be enhanced.

What is claimed is:

1. A method for manufacturing a semiconductor laser diode comprising:

sequentially forming a buffer layer, a first clad layer, a first waveguide layer, an active layer, a second waveguide layer, a second clad layer, and a cap layer on a substrate;

forming an etching mask on the cap layer;

sequentially patterning the cap layer and the second clad layer using the etching mask, and forming a ridge structure by etching the second clad layer in a range of not exposing the active layer;

selectively forming a passivation layer by forming a metal layer selected from a group consisting of Ti and Zr, and oxidizing said metal layer, for covering the side walls of the cap layer and the second clad layer patterned as the ridge structure using the etching mask; and forming an electrode in contact with the cap layer on the passivation layer after the etching mask is removed.

2. The method of claim 1, wherein the passivation layer is formed by oxidizing said metal layer on the side walls of the ridge structure and the entire exposed surface around the ridge structure.

3. The method of claim 1, wherein the substrate is a sapphire substrate, a GaN substrate or an SiC substrate.

4. The method of claim 1, wherein the buffer layer and the first waveguide layer are n-type GaN layers, the first clad layer is an n-type AlGaN/GaN layer, the active layer is an InGaN MQW layer, the second waveguide layer and the cap layer are p-type GaN layers, and the second clad layer is a p-type AlGaN/GaN layer.

5. The method of claim 1, wherein the etching mask is a photoresist layer, a silicon oxide layer, or a nickel layer.

6. The method of claim 1, wherein the electrode is formed of a Pd layer.

7. A method for manufacturing a semiconductor laser diode comprising:

sequentially forming a buffer layer, a first clad layer, a first waveguide layer, an active layer, a second waveguide layer, a second clad layer, and a cap layer on a substrate;

forming an etching mask on the cap layer;

sequentially patterning the cap layer and the second clad layer using the etching mask, and forming a ridge structure by etching the second clad layer in a range of not exposing the active layer;

forming a metal layer on the entire surface of the exposed surface including the ridge structure, in which the cap layer and the second clad layer are sequentially patterned;

removing the etching mask;

oxidizing the metal layer after removing the etching mask; and forming an electrode in contact with the cap layer on the oxide metal layer wherein the metal layer is formed of a Ti layer, a Zr layer, or an Si layer.

8. The method of claim 7, wherein the metal layer is oxidized by heat-treatment in an oxygen atmosphere.

* * * * *